United States Patent
de Micheli et al.

[11] Patent Number: 6,140,867
[45] Date of Patent: Oct. 31, 2000

[54] TRANSCONDUCTANCE CONTROL CIRCUIT, PARTICULARLY FOR CONTINUOUS-TIME CIRCUITS

[75] Inventors: Marco de Micheli, Binago; Salvatore Portaluri, Pavia; Giacomino Bollati, Castel San Giovanni; Melchiorre Bruccoleri, Rho, all of Italy

[73] Assignee: STMicroelectronics, S.r.l., Agrate Brianza, Italy

[21] Appl. No.: 09/312,003

[22] Filed: May 14, 1999

[30] Foreign Application Priority Data

May 15, 1998 [EP] European Pat. Off. ............. 98830296

[51] Int. Cl.[7] .................................................. H03B 1/00
[52] U.S. Cl. ............................................. 327/553; 327/103
[58] Field of Search ................................... 327/103, 552, 327/553, 558, 577, 599

[56] References Cited

U.S. PATENT DOCUMENTS

| 5,572,163 | 11/1996 | Kimura et al. | 327/553 |
| 5,650,950 | 7/1997 | Siniscalchi et al. | 364/607 |
| 5,912,583 | 6/1999 | Pierson et al. | 327/553 |
| 6,040,671 | 3/2000 | Brito et al. | 318/603 |

FOREIGN PATENT DOCUMENTS 0 561 099 A1  9/1993  European Pat. Off. .

OTHER PUBLICATIONS

Geiger et al.. "Active Filter Design Using Operational Transconductance Amplifiers: A Tutorial," *IEEE Circuits and Devices Magazine*, 1(2):20–32, Mar. 1985.

*Primary Examiner*—Tuan T. Lam
*Assistant Examiner*—Linh Nguyen
*Attorney, Agent, or Firm*—Theodore E. Galanthay; Robert Iannucci; Seed IP Law Group PLLC

[57] ABSTRACT

Embodiments of the invention provide a transconductance control circuit, particularly for a continuous-time filter, comprising a transconductor across which a constant voltage is input. The transconductor is connected to a digital-to-analog converter (DAC) to set a reference current. A feedback loop is provided between an output of the transconductor and an input. In particular, the circuit further comprises a means for mirroring the reference current set by the DAC both to the feedback loop and to at least one cell of a cascade-connected filter.

20 Claims, 2 Drawing Sheets

TRANSCONDUCTANCE CONTROL CIRCUIT, PARTICULARLY FOR CONTINUOUS-TIME CIRCUITS

TECHNICAL FIELD

The present invention relates to a transconductance control circuit, and in particular, to a transconductance control circuit for continuous-time circuits.

BACKGROUND OF THE INVENTION

It is known that in continuous-time filters utilizing a transconductor and a capacitor, with a ratio between transconductance and capacitance determining a cutoff frequency of the filter. It is often desirable to have a capacitance that can control the transconductance and thus maintain a constant cutoff frequency for the filter. In various applications of continuous-time filters, it is also often desirable to be able to program the cutoff frequency of the filter.

For example, in read channels for hard disk drives, it is often necessary to equalize a signal arriving from a read head of the hard disk. Part of the equalization occurs in the analog domain by means of a filter, whose cutoff frequency should be programmable in a range between 1 and 10 and at a sufficiently high speed. Such cases usually use a transconductor filter as mentioned above, in which frequency programming occurs by controlling the transconductance of the filter. It is also important, therefore, to control the transconductance so as to allow variation of the cutoff frequency according to specific requirements.

A conventional transconductor filter is usually provided by means of a plurality of cascade-connected cells, whose number depends on the order of the filter to be provided. For example, a filter with three cells is a third-order filter. In particular, inside the filter, a so-called "master section" and a "slave section" are provided. The master section acts as a reference for the transconductance of the filter and sets a current which is then sent to the subsequent cells that belong to the slave section. All the various cells of the filter are of the same type and are similar to the master section of the filter. The transconductances of the cells of the slave section determine the cutoff frequency of the filter.

FIG. 1 is a circuit diagram of a transconductor filter comprising a master section 1 and a plurality of cells 2 and 3 (only two cascade-connected cells are shown in this case), forming the slave section of the filter. The master section 1 further comprises a transconductor 4, the input whereof receives a constant voltage $V_{DD}$ generated with absolute precision, so that $V_{DD}$ does not vary over time, and a capacitor 5 downstream of the transconductor 4. A digital-to-analog converter (DAC) 7 is connected to a node 6, is adapted to generate a reference current $I_R$, and receives a digital word FC-WORD input. An output current from the transconductor 4 is the same that is set by the DAC 7.

The DAC 7 multiplies a fixed reference current, set by a current source 8, by the digital word FC-WORD to obtain in output a reference current $I_R$. $I_R$ is substantially equal to the voltage input $V_{DD}$ to the transconductor 4 multiplied by a transconductance (defined by the expression $$g_m = \frac{\Delta I}{\Delta V},$$

where I represents current into the transconductor 4 from a current source 12 and V represents the constant voltage provided by $V_{DD}$) of the transconductor 4. The digital word FC-WORD is used to adjust the transconductance of the filter (e.g., to vary its cutoff frequency). This is done by modifying the digital word that is multiplied by the reference current set by the source 8.

A PMOS transistor 9 has a gate terminal connected to the node 6 and a drain terminal connected to a drain terminal of an NMOS transistor 10. The NMOS transistor 10 has in turn a gate terminal connected to a gate terminal of an additional NMOS transistor 11, which has a source terminal connected to a source terminal of the NMOS transistor 10. The NMOS transistor 11 is common-ground connected and has a drain terminal connected to the transconductor 4. The MOS transistors 9, 10, and 11 constitute a feedback loop which forces the transconductor 4 to have the desired transconductance.

The transconductors 15 and 16 belonging to the cells of the filter 2 and 3 are set to the same bias as the master section 1 (e.g., to the same current that is mirrored by the NMOS transistor 10). In this manner, the current set by the master section 1 is sent to all the cascade-connected cells that constitute the filter. The biasing current is varied by changing the digital word FC-WORD entered into the DAC 7. Accordingly, the transconductance of the transconductance filter shown in FIG. 1 is controlled at will, thus allowing the cutoff frequency to be varied as desired.

The above-described structure, however, entails some drawbacks. For instance, if the transconductance of the transconductance filter has to be programmed, it is necessary to be able to quickly vary the transconductances so as to reach a steady-state value and then modify the cutoff frequency of the filter. In the case of the above-described circuit of FIG. 1, a time constant set by the capacitor 5 limits the time during which the transconductance of the transconductance filter settles.

Another time constant to be taken into account is the one required to bring the gate terminals of the MOS transistor 10 and of the other transistors of the cells 2, 3 to the steady state. The higher the order of the filter (e.g., the larger the number of cells of the transconductance filter), the greater this time constant.

The large time constant is particularly troublesome if one wishes to have a widely adjustable filter, for example adjustable over a range between 1 and 10 (e.g., a filter in which the cutoff frequency can be varied by a factor of up to 10). It is desirable that the settling time of the filter is the shortest possible, but one is limited by the above-described time constants. It is in fact necessary to wait until the feedback loop provided by the MOS transistors 9, 10, and 11 enters the steady state before the transconductance of the transconductance filter can settle.

SUMMARY OF THE INVENTION

An advantage of an embodiment of the present invention is to provide a transconductance control circuit, particularly for continuous-time filters, in which a transconductance settling time, following a request to vary the cutoff frequency of the filter, can be obtained in a considerably shorter time than with conventional solutions.

Further, an advantage of embodiments of the present invention is to provide a transconductance control circuit, particularly for continuous-time filters, in which a considerable percentagewise reduction in a transconductance correction performed by a feedback loop of the circuit is achieved.

Another advantage of embodiments of the present invention is to provide a transconductance adjustment circuit, particularly for continuous-time filters, which meets requirements of high speed in programming the transconductance of the filters.

Yet another advantage of embodiments of the present invention is to provide a transconductance control circuit, particularly for continuous-time filters, which is highly reliable, relatively easy to manufacture and at competitive costs.

These advantages and others which will become apparent hereinafter are achieved by a transconductance control circuit, comprising a transconductor across which a constant voltage is input, the transconductor being connected to a DAC to set a reference current, a feedback loop being provided between an output of said transconductor and an input, wherein the control circuit further comprises a means for mirroring the reference current set by said DAC, the means being adapted to mirror the current both to the feedback loop and to at least one cell of a cascade-connected filter.

These advantages are also achieved by a transconductance control method, comprising:

generating a chosen reference current in a master section of a continuous-time filter and sending the current to a feedback loop of the master section to bias a transconductor of the master section, and simultaneously to cells of a slave section of the filter;

feeding back an output current from the transconductor and adding it algebraically to said reference current to modify a bias of the transconductor to a chosen transconductance; and sending a sum of the reference current and of the output current of the transconductor again to the transconductor and to the cells of the slave section.

BRIEF DESCRIPTION OF THE DRAWINGS

Further characteristics and advantages of the invention will become apparent from a description of an illustrated embodiment of the circuit according to the invention, illustrated by way of a non-limiting and non-exhaustive example in the accompanying drawings.

DETAILED DESCRIPTION OF THE ILLUSTRATED EMBODIMENTS

Figure 1:
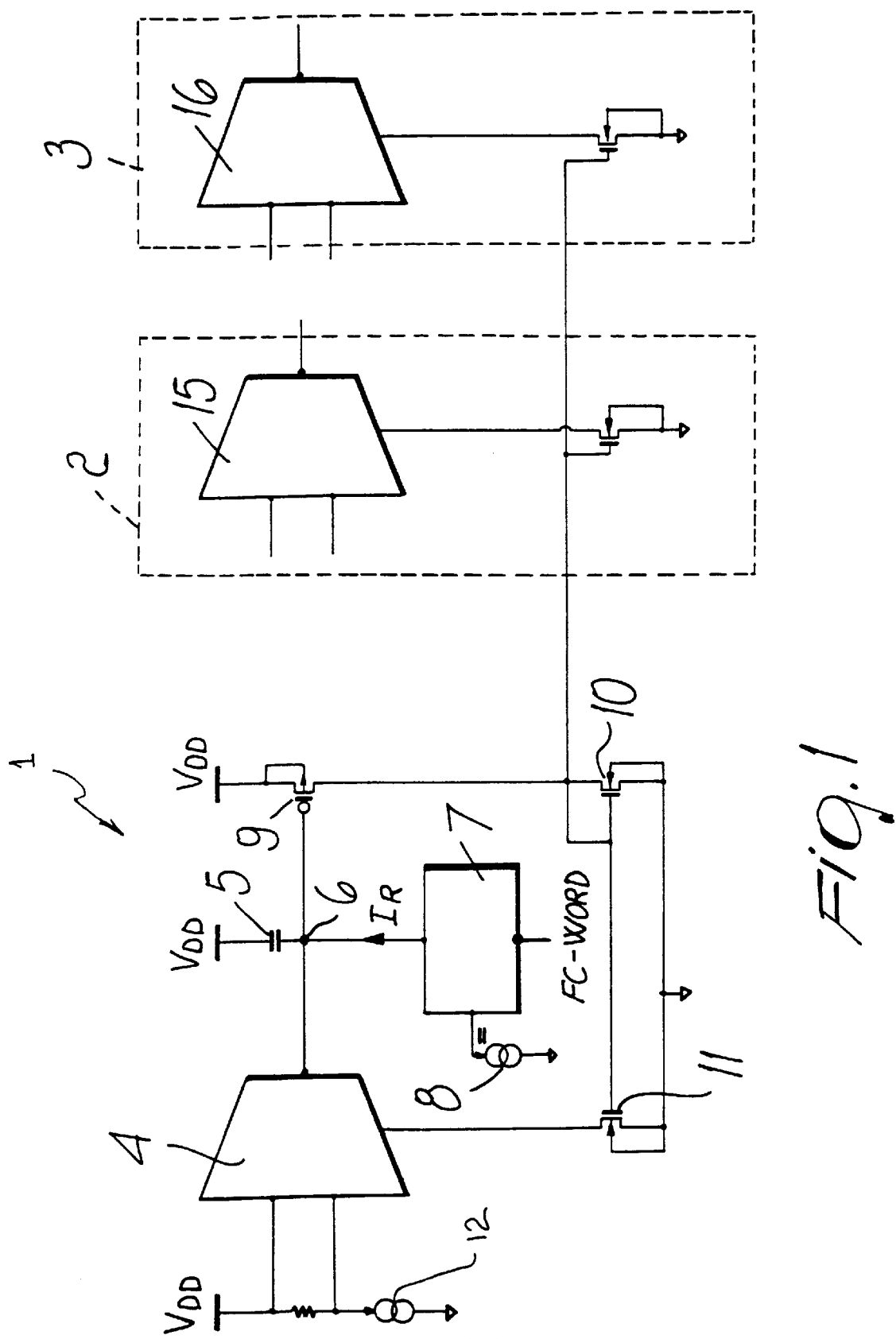
FIG. 1 is a circuit diagram of a conventional transconductor filter.
Figure 2:
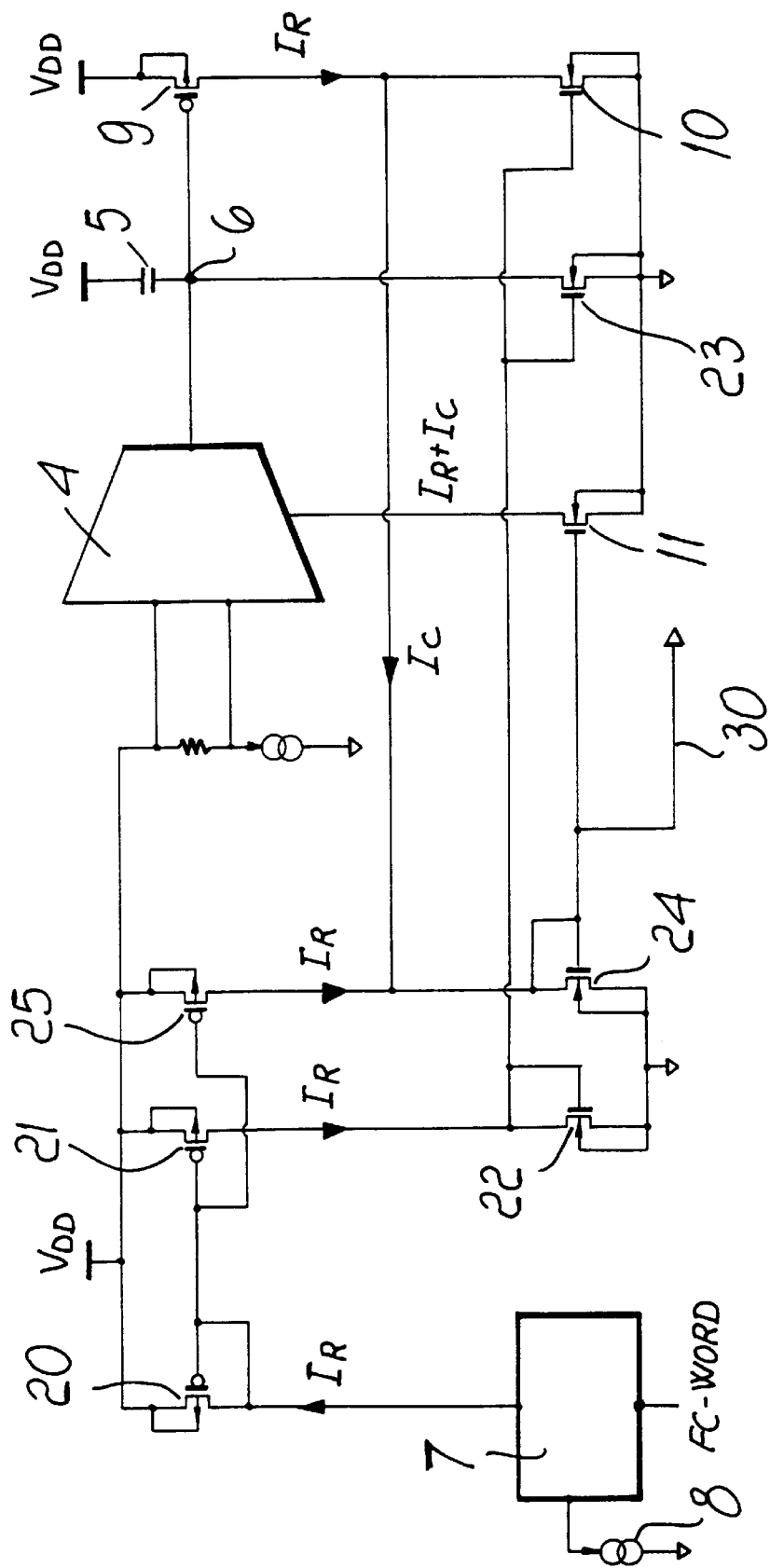
FIG. 2 is a circuit diagram of an embodiment of a master section of a transconductor filter according to the present invention.

FIG. 2 illustrates an embodiment of a circuit of the master section proposed by the present invention. Elements which are similar to those present in FIG. 1 are designated by identical reference numerals.

The output current $I_R$ from the DAC 7, set by the reference current generated by the source 8 and the digital word FC-WORD, is mirrored by a diode-connected PMOS transistor 20. The PMOS transistor 20 is connected to the DAC 7 by a drain terminal and to the supply voltage $V_{DD}$ by a source terminal. The current mirrored by the PMOS transistor 20 passes to a PMOS transistor 21 and is then sent to an NMOS transistor 22. The NMOS transistor 22 is diode-connected and mirrors the current to an NMOS transistor 23, which has a drain terminal connected to the node 6, whereto the capacitor 5 is connected. The NMOS transistor 22 thus sets the current for the NMOS transistor 23. The MOS transistors 9, 10, and 11 constitute, as in the case of FIG. 1, a feedback loop of the master section.

The current set in the slave cells (not shown in FIG. 2) of the filter is supplied by a diode-connected NMOS transistor 24, rather than the NMOS transistor 10. The NMOS transistor 24 has a drain terminal connected to a drain terminal of an additional PMOS transistor 25. The PMOS transistor 25 has a gate terminal connected to a gate terminal of the PMOS transistor 21 and a source terminal connected to the supply voltage $V_{DD}$. The PMOS transistor 25 therefore receives the current set by the mirror constituted by the PMOS transistor 20. A common point between drain terminals of the PMOS transistor 25 and the NMOS transistor 24 is connected to a common point between drain terminals of the PMOS transistor 9 and the NMOS transistor 10. A gate terminal of the NMOS transistor 10 is connected to a gate terminal of the NMOS transistor 23 and to a gate terminal of the NMOS transistor 22. The gate terminal of the NMOS transistor 22 is connected to its drain terminal.

The NMOS transistor 24 receives a current which is determined by the algebraic sum of the current $I_R$ set by the DAC 7 and a control current $I_C$ set by the feedback loop of the master section.

If the current $I_R$ set by the DAC 7, which is mirrored by the transistor 20 to the transistors 21, 25 and 22, 24 and then to the transistor 23, is the one supplied by the transconductor 4, then the control current $I_C$ is nil and an optimum situation occurs in which the transconductor 4 delivers exactly the current required by the DAC 7. The feedback loop therefore controls the current that is injected into the NMOS transistor 24, which is responsible for biasing the cells (not shown) of the filter that are arranged downstream of the master section. An arrow 30 in FIG. 2 denotes the connection of the master section to the slave section that contains the cells of the filter.

The illustrated embodiment of the invention thus biases the transconductor 4 in an open loop by means of a current which is proportional to the current $I_R$. In this manner, the feedback loop has to correct only bias variations due to temperature, process, and power supply variations.

Accordingly, the settling time of the transconductor 4 (and therefore of the transconductors of the cells of the slave section) is shorter than in the circuit shown in FIG. 1. This is because all the transconductors are biased by the current set by the NMOS transistor 24, which receives the current set by the DAC 7. This allows the feedback loop to complete its task and modify, if necessary, the current set by the NMOS transistor 24 sent to the cells of the slave section.

In practice, it has been observed that the illustrated embodiment of the circuit according to the present invention considerably reduces the settling time of the transconductance of the master section and of the slave sections of the filter, and at the same time, reduces percentagewise the correction performed by the feedback loop of the master section.

The current set by the DAC 7 is in fact sent immediately to a transistor, which fixes the current that is directed to the cells of the slave section. The settling time required by the filter to reach the steady state is therefore reduced.

The transistor that closes the feedback loop on the transconductor 4 feeds to the feedback loop the current which is the sum of the current $I_R$ set by the DAC 7 and of the control current $I_C$. The resulting sum current is mirrored by the transistor 24 that sets the current for the cells of the slave section.

The above description of an illustrated embodiment of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. Aspects of the invention can be modified, if necessary, to employ other technically equivalent elements.

Therefore, changes can be made to the invention in light of the above detailed description. In general, in the following claims, the terms used should not be construed to limit the invention to the specific embodiments disclosed in the specification and the claims. Accordingly, the invention is not limited by the disclosure, but instead the scope of the invention is to be determined entirely by the following claims, which are to be construed in accordance with established doctrines of claim interpretation.

What is claimed is:

1. A transconductance control circuit, for a continuous-time filter, comprising:
    a transconductor across which a constant voltage is input, said transconductor being connected to a digital-to-analog converter (DAC) to set a reference current;
    a feedback loop provided between an output node of said transconductor and an input; and
    a means for mirroring the reference current set by said DAC to said feedback loop and to at least one cell of a cascade-connected filter.

2. The circuit according to claim 1 wherein said means for mirroring comprise a PMOS transistor for mirroring the reference current set by said DAC to a pair of PMOS transistors having common-connected gate terminals, wherein the pair of PMOS transistors are connected to a pair of NMOS transistors, wherein one of said NMOS transistors mirrors the reference current set by said DAC to said feedback loop.

3. The circuit according to claim 2 wherein said feedback loop comprises a first PMOS transistor suitable to produce a gain and has a drain terminal connected to a drain terminal of an NMOS transistor, wherein the NMOS transistor has a gate terminal connected to a gate terminal and drain terminal of one of the NMOS transistors of said pair of NMOS transistors, said feedback loop further comprising an additional pair of NMOS transistors having drain terminals connected respectively to the output node of said transconductor and directly in feedback to said transconductor to close said feedback loop.

4. The circuit according to claim 3 wherein common drain terminals of the first PMOS transistor and of one of the NMOS transistors that comprise said feedback loop are connected to a drain terminal of the NMOS transistor that mirrors the reference current set by the DAC to said feedback loop and to said at least one cell of the filter.

5. The circuit according to claim 2 wherein said NMOS transistor that mirrors the reference current set by the DAC to said feedback loop and to said at least one cell of the filter receives in input to a drain terminal said reference current set by the DAC, wherein said reference current is summed algebraically with a control current arriving from said feedback loop.

6. The circuit according to claim 1, characterized in that said DAC receives in input a fixed reference current.

7. The circuit according to claim 1, further comprising a PMOS transistor connected to an output to said DAC, wherein said PMOS transistor is diode-connected.

8. The circuit according to claim 2 wherein said NMOS transistor that mirrors the reference current set by said DAC to said feedback loop and to said at least one cell of the filter is diode-connected.

9. The circuit according to claim 1 wherein said DAC receives in input a digital word, wherein variation of the digital word allows modification of the reference current set by said DAC.

10. The circuit according to claim 1, further comprising a current source connected to the DAC to provide an input current to the DAC, wherein the reference current is obtained by multiplying the input current by a digital word.

11. A transconductance control method, comprising:
    generating a predetermined reference current in a master section of a continuous-time filter and sending the predetermined reference current to a feedback loop of said master section to bias a transconductor of said master section and simultaneously to cells of a slave section of said filter;
    feeding back a current in output from said transconductor and adding the current in output algebraically to said predetermined reference current to modify a bias of said transconductor to a selected transconductance; and
    sending a sum of said predetermined reference current and of said output current of the transconductor again to said transconductor and to said cells of the slave section.

12. The method of claim 11, further comprising:
    providing the feedback loop with first PMOS transistor having a drain terminal connected to a drain terminal of an NMOS transistor; and
    connecting a gate terminal of the NMOS transistor to gate terminals of a pair of NMOS transistors and to a drain terminal of one of the NMOS transistors of the pair.

13. The method of claim 11 wherein the generating the predetermined reference current comprises:
    providing an input current and a digital word input to a digital-to-analog converter (DAC); and
    multiplying the input current by the digital word to obtain the reference current.

14. The method of claim 11, further comprising modifying a transconductance of the transconductor by changing a digital word input to an analog-to-digital converter (DAC) coupled to the transconductor.

15. A transconductance control circuit for a continuous-time filter, comprising:
    a master stage configured to supply a reference current to a slave stage, the master stage including a transconductor having an input and an output and configured to receive a constant voltage on the transconductor input, the master stage further including a digital-to-analog converter (DAC) coupled to the transconductor output and configured to generate the reference current;
    a slave stage configured to receive the reference current from the master stage, the slave stage including at least one cascade-connected filter cell;
    a feedback loop coupled between the transconductor output and the transconductor input; and
    a mirroring circuit to mirror the reference current to the feedback loop and to the cascade-connected filter cell.

16. The circuit of claim 15 wherein the feedback loop further comprises:
    first, second, and third PMOS transistors;
    first and second NMOS transistors coupled the second and third PMOS transistors, respectively, wherein the first PMOS transistor is configured to mirror the DAC reference current to the second and third PMOS transistors and the first NMOS transistor is configured to mirror the reference current to the feedback loop.

17. The circuit of claim 15 wherein the feedback loop further comprises a first PMOS transistor having a drain terminal connected to a drain terminal of an NMOS transistor, wherein a gate terminal of the NMOS transistor is connected to gate terminals of a pair of NMOS transistors and to a drain terminal of one of the NMOS transistors of the pair.

18. The circuit of claim 15, further comprising an input current and a digital word input to the DAC, wherein the reference current is obtained by multiplying the input current by the digital word.

19. The circuit of claim 15 wherein the mirroring circuit includes an NMOS transistor to mirror the reference current to the feedback loop and to the filter cell, the NMOS transistor having a drain terminal receiving as an input the reference current algebraically summed with a control current from the feedback loop.

20. The circuit of claim 15, further comprising a diode-connected PMOS transistor connected to an output of the DAC.

* * * * *